(12) United States Patent
Wagner et al.

(10) Patent No.: US 9,077,302 B2
(45) Date of Patent: Jul. 7, 2015

(54) AMPLIFIER FOR A WIRELESS RECEIVER

(75) Inventors: Grégory Wagner, Voiron (FR); Rayan Mina, Abu Dhabi (AE)

(73) Assignee: ST-Ericsson SA, Plan-les-Ouates (CH)

( * ) Notice: Subject to any disclaimer, the term of this patent is extended or adjusted under 35 U.S.C. 154(b) by 146 days.

(21) Appl. No.: 13/983,641

(22) PCT Filed: Feb. 7, 2012

(86) PCT No.: PCT/EP2012/052063
§ 371 (c)(1),
(2), (4) Date: Oct. 21, 2013

(87) PCT Pub. No.: WO2012/107452
PCT Pub. Date: Aug. 16, 2012

(65) Prior Publication Data
US 2014/0035675 A1    Feb. 6, 2014

Related U.S. Application Data

(60) Provisional application No. 61/450,329, filed on Mar. 8, 2011.

(30) Foreign Application Priority Data

Feb. 8, 2011 (EP) ..................................... 11305127

(51) Int. Cl.
*H03G 3/30* (2006.01)
*H03F 1/22* (2006.01)
(Continued)

(52) U.S. Cl.
CPC ............. *H03G 3/3036* (2013.01); *H03F 1/223* (2013.01); *H03F 3/195* (2013.01);
(Continued)

(58) Field of Classification Search
CPC ....................................................... H03G 3/32
USPC ...................... 330/144, 284; 455/249.1, 250.1
See application file for complete search history.

(56) References Cited

U.S. PATENT DOCUMENTS 6,288,609 B1    9/2001   Brueske et al.
6,724,897 B1 *  4/2004   Smith .............................. 381/61
(Continued)

FOREIGN PATENT DOCUMENTS

JP          200828908 A      2/2008
WO        2007014982 A1      2/2007
(Continued)

OTHER PUBLICATIONS

Purohit, A., "A New Linearity Enhancing Technique for Low Noise Amplifiers", IEEE Asia Pacific Conference on Circuits and Systems, Dec. 4, 2004, pp. 29-32, Singapore, IEEE.
(Continued)

*Primary Examiner* — Steven J Mottola
(74) *Attorney, Agent, or Firm* — Coats & Bennett, P.L.L.C.

(57) ABSTRACT

Amplifier (6) for a wireless receiver, the amplifier comprising a voltage amplifier module having a voltage gain switchable between a first voltage gain value and a second voltage gain value higher than the first gain value, and a resistance module having a resistance switchable between a first resistance value and a second resistance value higher than the first resistance value, an output of the voltage amplifier module being connected to an input of the resistance module, the amplifier further comprising a set of switches configured to set the voltage gain value and the resistance value, the amplifier being operable in:—a nominal mode of operation in which the voltage gain value is set to the second voltage gain value, the resistance value being set to the second resistance value, and—a high linearity mode of operation in which the voltage gain value is set to the first voltage gain value to improve linearity of the amplifier, the resistance value being set to the first resistance value to have the same ratio of the voltage gain value to the resistance value as in the nominal mode of operation.

13 Claims, 3 Drawing Sheets

(51) Int. Cl.
*H03F 3/195* (2006.01)
*H03G 1/00* (2006.01)
*H04B 1/10* (2006.01)

(52) U.S. Cl.
CPC .... *H03F 2200/144* (2013.01); *H03F 2200/156* (2013.01); *H03F 2200/294* (2013.01); *H03F 2200/411* (2013.01); H03G 1/0088 (2013.01); H03G 3/3052 (2013.01); H04B 1/109 (2013.01)

(56) References Cited

U.S. PATENT DOCUMENTS

| | | | |
|---|---|---|---|
| 6,965,655 | B1 | 11/2005 | Mostov et al. |
| 7,266,360 | B2 | 9/2007 | Kang et al. |
| 7,746,169 | B2 | 6/2010 | Deng et al. |
| 2004/0152429 | A1 | 8/2004 | Haub et al. |
| 2004/0214545 | A1* | 10/2004 | Kushima et al. ........... 455/232.1 |
| 2005/0075077 | A1 | 4/2005 | Mach et al. |
| 2006/0208791 | A1 | 9/2006 | Vihonen |
| 2007/0229154 | A1 | 10/2007 | Kim et al. |

FOREIGN PATENT DOCUMENTS

| | | |
|---|---|---|
| WO | 2010000643 A1 | 1/2010 |
| WO | 2010014806 A1 | 2/2010 |

OTHER PUBLICATIONS

Yoon, H. K. "Mulit-Standar Receiver for Bluetooth and WLAN Applications", Dissertation, Presented in Partial Fulfillment of the Requirements for the Degree Doctor of Philosophy in the Graduate School of the Ohio State University, 2004, pp. 1-166, The Ohai State University, US.

* cited by examiner

AMPLIFIER FOR A WIRELESS RECEIVER

TECHNICAL FIELD

The present invention generally relates to communication systems and more specifically to RF amplifier in wireless receivers.

BACKGROUND

The approaches described in this section could be pursued, but are not necessarily approaches that have been previously conceived or pursued. Therefore, unless otherwise indicated herein, the approaches described in this section are not prior art to the claims in this application and are not admitted to be prior art by inclusion in this section. Furthermore, all embodiments are not necessarily intended to solve all or even any of the problems brought forward in this section.

Radio Frequency (RF) systems generally comprise an antenna, connected to a RF receiver and to a RF transmitter via a Front-End Module (FEM). For example, the RF receiver may comprise a Low Noise Amplifier (LNA) and the RF transmitter may comprise a Power Amplifier (PA).

RF receivers have to maintain their performance even when receiving high-power blocking signals at the antenna. This is generally the case in Frequency Division Duplex (FDD) systems where the RF transmitter sends a high-level signal while the RF receiver receives a low-level signal. Usually the blocking signals are filtered prior to the Low Noise Amplifier (LNA) of the RF receiver, and sometimes after the LNA.

In some cases, an intermodulation product between an incoming blocking signal and the own transmission signal leakage (due to finite isolation between amplifiers PA and LNA) may fall into the frequency bandwidth of the low-level reception signal. In such cases, the RF receiver sensitivity is jeopardized and the performance is below requirements.

These scenarios may be very frequent depending on the transmission-reception frequency separation and on the blocking signal spectral position. The levels of the blocking signal are specified by the standardization organization of the targeted RF communication system.

Moreover, in most modern mobile communication devices, the RF system, i.e. the cellular Radio Frequency Integrated Circuit (RF-IC), is coexisting with other radio engines, e.g. Bluetooth and Wireless LAN. In this case, the blocking signal is coming from a transmitter exhibiting thereby very high power levels. Even with good antenna isolation between radio engines and good RF filtering performance between the cellular antenna and the input of the reception path, intermodulation products may completely desensitize the receiver.

To overcome this coexistence issue a highly linear RF front-end (LNA and mixer) must be designed.

At the present time, existing RF CMOS front-end solutions are using inductors for output load and for feedback loops to achieve a high linearity in LNA circuits. Such components require large areas to be integrated properly with good quality factors.

Other solutions use thick oxide MOS devices along with above nominal process supply voltage. Such devices require an additional process mask during fabrication which significantly increases the cost of the overall processing in mass production. Also they slightly increase the overall power consumption of the RF front-end.

Other solutions comprise passive transferred impedance filtering at the LNA output. Such technique cannot work efficiently with feedback LNA as input impedance at blocker frequency will increase and voltage swing at the amplifier input accordingly. Besides, such filter requires large capacitor area to work properly along with additional RF phase generation.

U.S. Pat. No. 6,288,609 describes a 2-stage LNA with an Automatic Gain Control (AGC) system that commands the gain of the 2nd stage (VGA) and the bias of the 1st stage (amplifier feedback stage) to achieve gain control and linearity enhancement respectively. The total LNA gain does not remain constant when linearity enhancement is activated, and, as a consequence, noise performance is decreased.

U.S. Pat. No. 7,746,169 describes a LNA with two possible modes of operation: a distortion cancellation mode (PDC) for linearity improvement and a high-gain mode for sensitivity case. To improve LNA linearity, additional active devices are used to cancel 3rd order intermodulation products generated by the main active device. Moreover, the gain is decreased and as a consequence the power consumption will increase. The PDC has a gate-to-source voltage dependency and is sensitive to device mismatch. Therefore, it requires a proper calibration method to achieve the linearity improvement.

U.S. Pat. No. 7,266,360 describes an RF amplifier that includes a parasitic capacitor cancellation system, an image frequency filtering section and a gain controllable section. As in the systems described above, the total LNA gain does not remain constant, and, as a consequence, noise performance is decreased.

There is a need for improved methods and devices for enhancing linearity of an amplifier while maintaining the overall gain and power consumption of the amplifier constant.

SUMMARY

To address these needs, a first aspect of the present invention relates to an amplifier for a wireless receiver, the amplifier comprising a voltage amplifier module having a voltage gain switchable between a first voltage gain value and a second voltage gain value higher than the first gain value, and a resistance module having a resistance switchable between a first resistance value and a second resistance value higher than the first resistance value, an output of the voltage amplifier module being connected to an input of the resistance module, the amplifier further comprising a set of switches configured to set the voltage gain value and the resistance value, the amplifier being operable in:

a nominal mode of operation in which the voltage gain value is set to the second voltage gain value, the resistance value being set to the second resistance value, and a high linearity mode of operation in which the voltage gain value is set to the first voltage gain value to improve linearity of the amplifier, the resistance value being set to the first resistance value to have a similar ratio of the voltage gain value to the resistance value as in the nominal mode of operation.

The word "similar" means that the ratio of the voltage gain value to the resistance value is the same in the two modes of operation, or at least that the ratio has close values in the two modes of operation. For example, the ratio is similar with less than 5% difference.

The present invention aims to enhance the linearity of an amplifier for a wireless receiver while maintaining the overall gain and power consumption of the amplifier constant. This permits to obtain a constant Signal to Noise Ratio (SNR) by keeping constant all the noise contributions of the succeeding stages.

According to embodiments of the invention, the amplifier comprising a detection circuit configured to detect a risky intermodulation scenario in which the wireless receiver may be desensitized, the high linearity mode of operation being activated when a risky intermodulation scenario is detected.

According to other embodiments of the invention, the amplifier is configured to be connected to a detection circuit configured to detect a risky intermodulation scenario in which the wireless receiver may be desensitized, the high linearity mode of operation being activated when a risky intermodulation scenario is detected.

The voltage amplifier module may comprise a fixed gain part with a fixed voltage gain and a commutable gain part with a commutable voltage gain, the resistance module comprising a first resistance in parallel with a second resistance, the set of switches comprising a first switch disposed in parallel with the commutable gain part, a second switch disposed between the output of the commutable gain part and the input of the resistance module, and a third switch disposed between the input of the resistance module and the first resistance, the first and third switches being open in the nominal mode of operation and closed in the high linearity mode of operation, the second switch being closed in nominal mode of operation and open in high linearity mode of operation.

The set of switches may further comprise a fourth switch disposed between the input of the resistance module and the second resistance, the fourth switch being closed in nominal mode of operation and open in high linearity mode of operation.

According to some embodiments of the invention, the voltage amplifier module comprises a first fixed resistance in parallel with a first commutable resistance, the resistance module comprising a second fixed resistance in parallel with a second commutable resistance, the set of switches comprising a first switch disposed between an input of the voltage amplifier module and the first commutable resistance, and a second switch disposed between the input of the resistance module and the second commutable resistance, the first and second switches being open in nominal mode of operation and closed in high linearity mode of operation.

A second aspect of the present invention relates to a method for controlling an amplifier of a wireless receiver, the amplifier comprising a voltage amplifier module having a voltage gain switchable between a first voltage gain value and a second voltage gain value higher than the first gain value, and a resistance module having a resistance switchable between a first resistance value and a second resistance value higher than the first resistance value, an output of the voltage amplifier module being connected to an input of the resistance module, the amplifier further comprising a set of switches configured to set the voltage gain value and the resistance value, the method comprising steps of:

testing whether a risky intermodulation scenario, in which the wireless receiver may be desensitized, is detected, if no risky intermodulation scenario is detected, activating a nominal mode of operation by setting the voltage gain value to the second voltage gain value, and by setting the resistance value to the second resistance value, and if a risky intermodulation scenario is detected, activating a high linearity mode of operation by setting the voltage gain value to the first voltage gain value to improve linearity of the amplifier, and by setting the resistance value to the first resistance value to have a similar ratio of the voltage gain value to the resistance value as in the nominal mode of operation.

In some embodiments of the invention, the voltage amplifier module comprises a fixed gain part with a fixed voltage gain and a commutable gain part with a commutable voltage gain, the resistance module comprising a first resistance in parallel with a second resistance, the set of switches comprising a first switch disposed in parallel with the commutable gain part, a second switch disposed between the output of the commutable gain part and the input of the resistance module, and a third switch disposed between the input of the resistance module and the first resistance. The step of activating the nominal mode of operation then comprises opening the first and third switches and closing the second switch, and the step of activating the high linearity mode of operation comprises closing the first and third switches and opening the second switch.

When the set of switches further comprises a fourth switch disposed between the input of the resistance module and the second resistance, the step of activating the nominal mode of operation comprises closing the fourth switch, and the step of activating the high linearity mode of operation comprises opening the fourth switch.

In some embodiments of the invention, the voltage amplifier module comprises a first fixed resistance in parallel with a first commutable resistance, the resistance module comprising a second fixed resistance in parallel with a second commutable resistance, the set of switches comprising a first switch disposed between an input of the voltage amplifier module and the first commutable resistance, and a second switch disposed between the input of the resistance module and the second commutable resistance, the step of activating the nominal mode of operation comprising opening the first and second switches, the step of activating the high linearity mode of operation comprising closing the first and second switches.

The wireless receiver may be part of a RF transmission-reception system of a user equipment, the user equipment further comprising a radio engine. The step of testing whether a risky intermodulation scenario is detected may then comprise:

testing whether a risky RF band is selected, and, if a risky RF band is selected, testing whether the radio engine is activated.

The step of testing whether a risky intermodulation scenario is detected may further comprise testing whether the transmission signal power is above a predetermined threshold.

A third aspect of the present invention relates to a computer program product comprising a computer readable medium, having thereon a computer program comprising program instructions, the computer program being loadable into a data-processing unit and adapted to cause the data-processing unit to carry out the steps of the method according to the second aspect when the computer program is run by the data-processing unit.

A fourth aspect of the present invention relates to a method for controlling an amplifier of a wireless receiver, the method comprising steps of:

testing whether a risky intermodulation scenario, in which the wireless receiver may be desensitized, is detected, if no risky intermodulation scenario is detected, activating a nominal mode of operation, and if a risky intermodulation scenario is detected, activating a high linearity mode of operation, the step of testing whether a risky intermodulation scenario is detected comprises:

testing whether a risky RF band is selected, and, if a risky RF band is selected, testing whether the radio engine is activated.

In some embodiments, the step of testing whether a risky intermodulation scenario is detected further comprises testing whether the transmission signal power is above a predetermined threshold.

BRIEF DESCRIPTION OF THE DRAWINGS

The present invention is illustrated by way of example, and not by way of limitation, in the figures of the accompanying drawings, in which like reference numerals refer to similar elements and in which.

DESCRIPTION OF EMBODIMENTS

Embodiments of the invention deal with the problem of enhancing the linearity of a RF amplifier of a wireless receiver while maintaining a constant overall gain.

Figure 1:
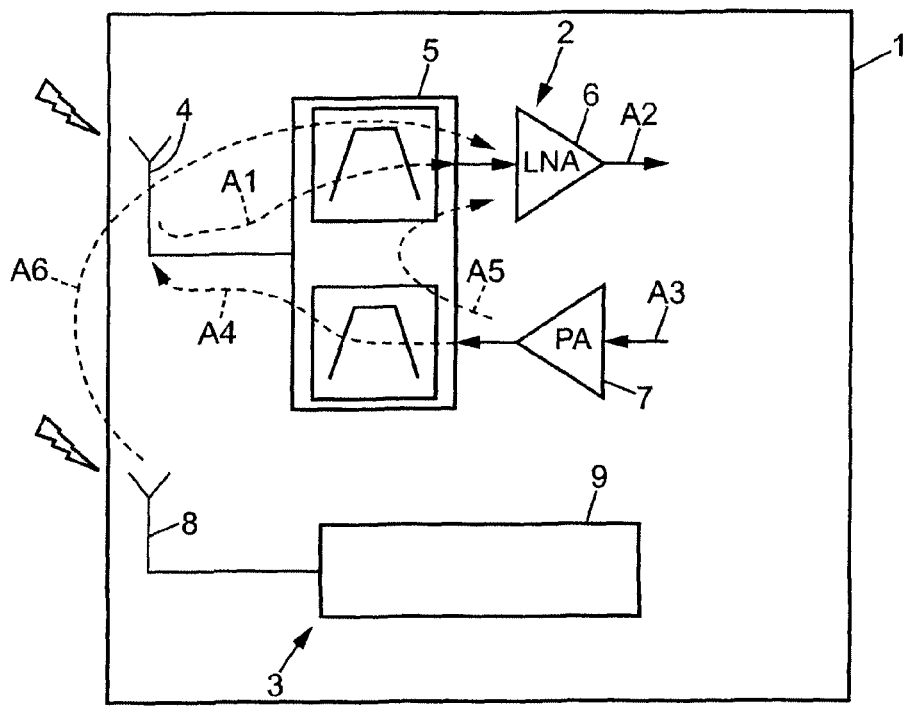
FIG. 1 is a schematic block diagram of a user equipment according to some embodiments of the invention.

FIG. 1 shows a user equipment (UE) 1, for example a mobile device, comprising a cellular RF transmission-reception system 2 and a connectivity radio engine 3, for example a WiFi or a Bluetooth or a WiMAX radio engine.

The RF transmission-reception system 2 comprises an antenna 4, a duplexer 5, a RF receiver and a RF transmitter. The RF receiver comprises a Low Noise Amplifier (LNA) 6 and other processing blocks not represented. The RF transmitter comprises a Power Amplifier (PA) 7 and other processing blocks not represented. The antenna 4 is connected to the duplexer 5. The duplexer 5 is connected to the LNA 6 and to the PA 7.

The WiFi/Bluetooth/WiMAX radio engine 3 comprises an antenna 8 and a processing unit 9, connected to each other.

When a RF signal is received at the antenna 4, it is transmitted to the LNA 6, via the duplexer 5, as symbolized by arrow A1. The RF signal is processed by the LNA 6, and then transmitted by the LNA 6 to another block of the RF receiver for further processing, as symbolized by arrow A2.

When a RF signal has to be transmitted by the antenna 4, it is transmitted to the PA 7, as symbolized by arrow A3, processed by the PA 7, and then transmitted from the PA 7 to the antenna 4, via the duplexer 5, as symbolized by arrow A4. Such a transmission generates a transmission leakage signal symbolized by arrow A5.

In the same way, when a blocker signal is transmitted by the antenna 8, it generates a blocker leakage signal, as symbolized by arrow A6.

These leakage signals may desensitize the RF receiver when they create third order intermodulation product ($IM_3$) falling into the reception channel bandwidth. However, the blocker and transmission signal leakages can create $IM_3$ falling into the reception channel bandwidth only if the following condition between their frequencies is met:

$$F_{Blocker} = 2F_{TX} + F_{RX} \quad \text{Equation 1:}$$

where $F_{blocker}$ represents the blocker signal frequency, $F_{TX}$ represents the transmission signal frequency and $F_{RX}$ represents the reception signal frequency.

The scenarios that satisfy the condition stated in Equation 1 are called risky scenarios as they can desensitize the RF receiver. In the same way, the specific RF bands in which these scenarios occur are called risky bands.

A risky scenario may arise, for example, when a mobile terminal user connects his Bluetooth kit while being far away from the cellular base station with which a communication is established in a risky RF band. In this case, the power of the reception signal is low, the transmission signal is at maximum output power and, as a consequence, the intermodulation between Bluetooth blocker leakage and own cellular transmission leakage may cut-off the communication.

Depending on the bandwidth of the modulations and their carrier frequencies, there is a mitigation factor $M_f$ resulting from the intermodulation process that may reduce the $IM_3$ power, the latter can be calculated as follows:

$$IM_3 = (2P_{TX,leakage} + P_{blocker,leakage}) - 2IIP_3 - M_f \quad \text{Equation 2:}$$

Where $P_{TX,leakage}$ the transmission leakage signal power, $P_{blocker,leakage}$ is the blocker leakage signal power, and $IIP_3$ is the third order input intercept point of the RF receiver.

The $IIP_3$ performance needed when Wide-band Code Division Multiple Access (WCDMA) or Evolved Universal Terrestrial Radio Access (E-UTRA) must coexist with WiFi/Bluetooth/WiMAX may be estimated from Equation 2, by taking into account duplexer transmission-reception isolation, reception out-of-band attenuation and mitigation factor $M_f$ value (coming from proper electrical simulations).

For example, the $IIP_3$ needed can be as high as +8 dBm to keep RF receiver performance at nominal values when a risky scenario occurs. From this estimation we may deduce that at least 6 dB of linearity enhancement is required from already highly-linear state-of-the-art LNAs.

An objective of the invention is to enhance linearity while maintaining the overall gain and power consumption of the LNA 6 constant. This feature permits to obtain a constant Signal to Noise Ratio (SNR) needed for a proper demodulation of the communication channel.

On the contrary, with current state-of-the-art LNA, if the before-mentioned risky scenarios occur the SNR obtained at the Digital Base Band Integrated Circuit (DBB-IC) stage may be several dB below requirement, meaning that the communication channel is completely cut.

Figure 2:
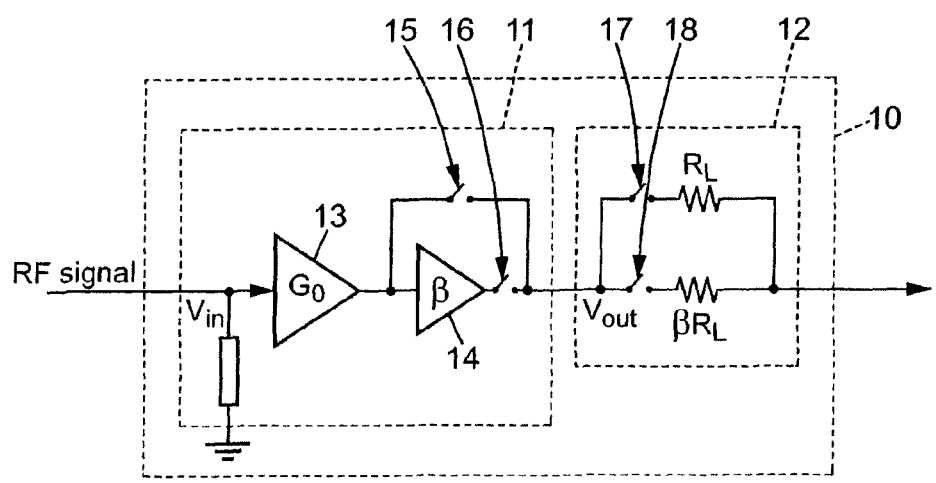
FIG. 2 is a schematic block diagram of an amplifier of a wireless RF receiver according to some embodiments.

FIG. 2 represents an amplifier 10 of a wireless RF receiver, for example a LNA, according to embodiments of the invention. The amplifier 10 comprises a voltage amplifier module 11 and a resistance module 12. The input of the voltage amplifier module 11 is configured to receive a RF signal from an antenna connected to the RF receiver via a FEM. The output of the voltage amplifier module 11 is connected to the input of the resistance module 12. The output of the resistance module 12 is for example connected to a mixer of the RF receiver.

The voltage amplifier module 11 comprises a fixed gain part 13 with a fixed gain $G_0$ and a commutable gain part 14 with a commutable gain $\beta$.

The resistance module 12 comprises a resistance $R_L$ in parallel with a resistance $\beta R_L$.

A first switch 15 is disposed in parallel with the commutable gain part 14, that is to say between the input of the commutable gain part 14 and the output of the commutable gain part 14. A second switch 16 is disposed between the output of the commutable gain part 14, that is to say the output of the voltage amplifier module 11, and the input of the resistance module 12. A third switch 17 is disposed between the input of the resistance module 12 and the resistance $R_L$. A fourth switch 18 is disposed between the input of the resistance module 12 and the resistance $\beta R_L$.

The first and third switches 15, 17 are controlled to be open simultaneously and to be close simultaneously. The second and fourth switches 16, 18 are controlled to be open simultaneously and to be close simultaneously. The switches are further controlled such that the first and third switches 15, 17 are open when the second and fourth switches 16, 18 are close, and the first and third switches 15, 17 are close when the second and fourth switches 16, 18 are open.

In variant, the switch 17 may be disposed between the resistance $R_L$ and the output of the resistance module 12. In the same way, the switch 18 may be disposed between the resistance $\beta R_L$ and the output of the resistance module 12. The linearity of the amplifier can thus be further improved because the switches are at the output.

Figure 3:
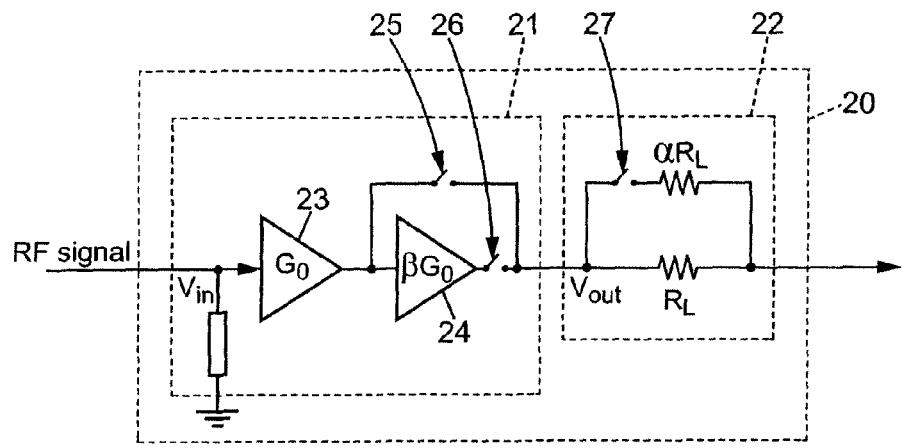
FIG. 3 is a schematic block diagram of an amplifier of a wireless RF receiver according to other embodiments.

FIG. 3 represents an amplifier 20 of a wireless RF receiver according to other embodiments of the invention. As described above, the amplifier 20 comprises a voltage amplifier module 21 and a resistance module 22.

The voltage amplifier module 21 comprises a fixed gain part 23 with a fixed gain $G_0$ and a commutable gain part 24 with a commutable gain $\beta G_0$.

The resistance module 22 comprises a fixed resistance $R_L$ in parallel with a commutable resistance $\alpha R_L$.

A first switch 25 is disposed in parallel with the commutable gain part 24, that is to say between the input of the commutable gain part 24 and the output of the commutable gain part 24. A second switch 26 is disposed between the output of the commutable gain part 24 and the input of the resistance module 22. A third switch 27 is disposed between the input of the resistance module 22 and the commutable resistance $\alpha R_L$.

In this embodiment, there is no switch disposed between the input of the resistance module 22 and the fixed resistance $R_L$.

The first and third switches 25, 27 are controlled to be open simultaneously and to be close simultaneously. The switches are further controlled such that the first and third switches 25, 27 are open when the second switch 26 is close, and the first and third switches 25, 27 are close when the second switch 26 is open.

In variant, the switch 27 may be disposed between the resistance $\alpha R_L$ and the output of the resistance module 22.

Figure 4:
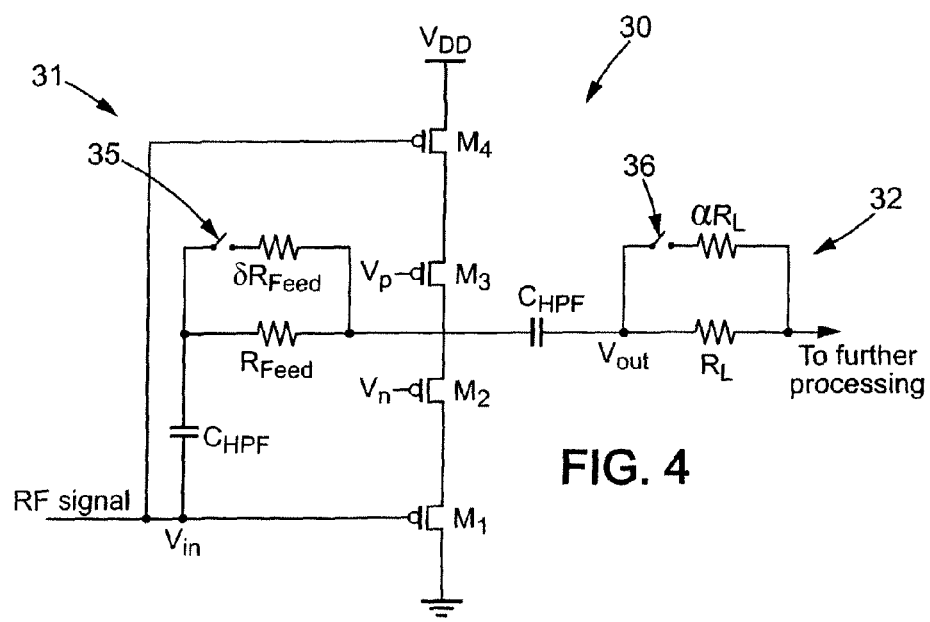
FIG. 4 is a diagram of an amplifier implementation according to some embodiments.

FIG. 4 represents an example of implementation of an amplifier 30 of a wireless RF receiver according to embodiments of the invention. As described above, the amplifier 30 comprises a voltage amplifier module 31 and a resistance module 32.

The resistance module 32 comprises a fixed resistance $R_L$ in parallel with a commutable resistance $\alpha R_L$.

The voltage amplifier module 31 is a wide-band inductorless resistive-feedback voltage amplifier. The voltage amplifier module 31 comprises a fixed resistance $R_{Feed}$ in parallel with a commutable resistance $\delta R_{Feed}$. The voltage amplifier module 31 further comprises four transistors $M_1$, $M_2$, $M_3$ and $M_4$.

A first switch 35 is disposed between the input of the voltage amplifier module 31 and the commutable resistance $\delta R_{Feed}$. A second switch 36 is disposed between the input of the resistance module 32 and the commutable resistance $\alpha R_L$.

The first and second switches 35, 36 are controlled to be open simultaneously and to be close simultaneously. The switches 35, 36 permit to choose between two possible values for resistances $R_L$ and $R_{feed}$, that is to say to choose between $R_L$ and $\alpha R_L$, and to choose between $R_{feed}$ and $\delta R_{Feed}$. Both switches 35, 36 are commanded with the same control signal.

Therefore whenever resistance $R_L$ is changed, resistance $R_{feed}$ is changed accordingly. In this way, input impedance matching is preserved from any change during High Linearity Mode (HLM) operation, which is described below.

A RF signal received in the input of the voltage amplifier module 31, for example from an antenna connected to the RF receiver via a FEM, is injected into the gates of transistors M1 and M4 which works in parallel to amplify the input signal. Cascode transistors M2 and M3 insure high output impedance with respect to resistance $R_L$ to maximize voltage gain.

A feedback by means of resistance $R_{feed}$ is used to achieve impedance matching at the amplifier input node.

The amplifier 30 may further comprise two capacitors $C_{HPF}$, which are used as DC blocks at the output and in the feedback paths to allow different DC operating points.

In variant, the switch 36 may be disposed between the resistance $\alpha R_L$ and the output of the resistance module 32.

This linearization system is very well adapted to CMOS single-chip solutions for mobile platforms and to low-voltage operation. Only switches are required to work properly and activate dynamically the dual-mode of operation. It ensures a high flexibility in the implementation of the linearization technique. It does not require any additional component thus saving a lot of area compared to other linearization techniques in the state-of-the-art.

As voltage gain is reduced and gain steadiness is insured by load variation, the power consumption of the RF amplifier cannot increase in any way.

Figure 5:
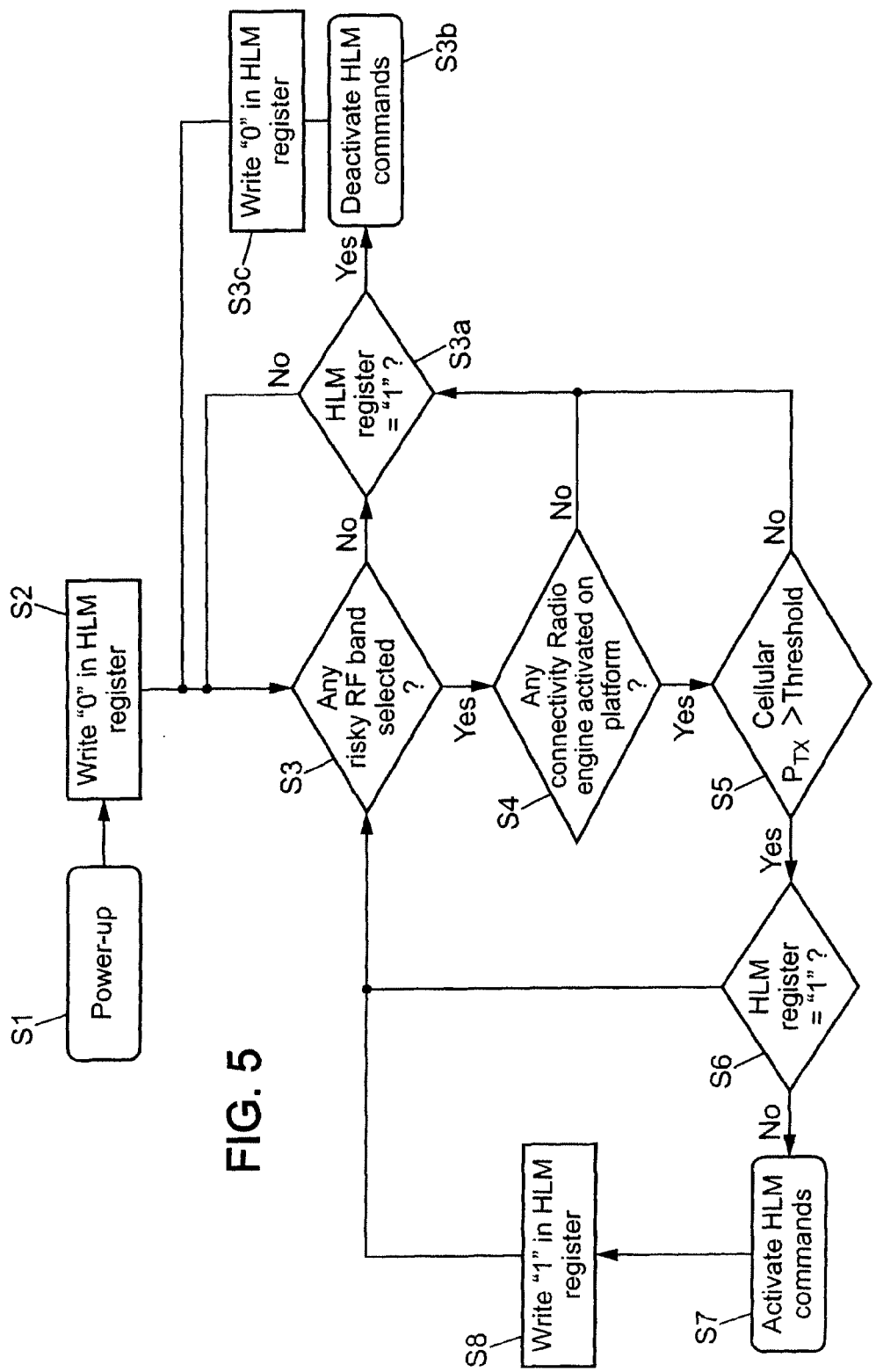
FIG. 5 is a flow chart showing steps of a method for controlling an amplifier according to embodiments of the invention.

Amplifier 6, 10, 20, 30 of the RF receiver is configured to implement a method for controlling the amplifier, in particular for performing a dynamic linearization, for example in the presence of the previously described risky scenarios. Referring to FIG. 5 we are describing below the method according to embodiment of the invention.

In step S1, the user equipment containing the amplifier 6, 10, 20, 30 is powered up.

In step S2, the amplifier 6, 10, 20, 30 writes a first value, called value '0', in a HLM register.

In step S3, the amplifier 6, 10, 20, 30 tests whether any risky RF band is selected. If a risky RF band is selected, the method goes to step S4. If not the method goes to step S3a.

In step S3a, the amplifier 6, 10, 20, 30 tests whether the HLM register contains a second value, called value '1'. If the HLM register contains value '1', the method goes to step S3b. If not, the method returns to step S3.

In step S3b, the amplifier 6, 10, 20, 30 deactivates HLM commands. The amplifier 6, 10, 20, 30 is thus set in nominal mode.

To set the nominal mode in embodiment shown in FIG. 2, the first and third switches 15, 17 are opened and the second and fourth switches 16, 18 are closed. In embodiment shown in FIG. 3, the first and third switches 25, 27 are opened and the second switch 26 is closed. In embodiment shown in FIG. 4, the first and second switches 35, 36 are opened.

In a general way, to set the nominal mode, the commutable gain part is activated to increase the overall voltage gain. Accordingly, the resistance is set to increase the overall impedance value.

In the embodiment represented in FIG. 3, the gain and load of the amplifier 20 in normal linearity mode may be calculated as follows:

$$G_m = \frac{\beta \times G_0^2}{R_{Load}} \quad \text{Equation 3}$$

-continued $$G_v = \beta \times G_0^2$$

$$R_{Load} = R_L$$

In step S3c, the amplifier 6, 10, 20, 30 writes value '0' in HLM register. Then the method returns to step S3.

In step S4, the amplifier 6, 10, 20, 30 tests whether any radio engine 3 is activated. If a radio engine 3 is activated, the method goes to step S5. If not, the method returns to step S3a.

In step S5, the amplifier 6, 10, 20, 30 tests whether the transmission signal power is above a predetermined threshold. If the transmission signal power is above the predetermined threshold, the method goes to step S6. If not, the method returns to step S3a.

Steps S3, S4 and S5 permit to detect a risky intermodulation scenario. These steps are performed by a detection circuit, which may be integrated in the amplifier 6, 10, 20, 30 or connected to the amplifier.

In step S6, the amplifier 6, 10, 20, 30 tests whether the HLM register contains value '1'. If the HLM register contains value '1', the method returns to step S3. If not, the method goes to step S7.

In step S7, the amplifier 6, 10, 20, 30 activates HLM commands. The amplifier 6, 10, 20, 30 is thus set in high linearity mode.

To set the high linearity mode in embodiment shown in FIG. 2, the first and third switches 15, 17 are closed and the second and fourth switches 16, 18 are opened. In embodiment shown in FIG. 3, the first and third switches 25, 27 are closed and the second switch 26 is opened. In embodiment shown in FIG. 4, the first and second switches 35, 36 are closed.

In a general way, to set the high linearity mode, the commutable gain part of the voltage amplifier module of the amplifier is shut down to reduce the overall voltage gain and consequently the voltage swing $V_{out}$ that limits the amplifier linearity.

Accordingly, the resistance value of the resistance module is set to reduce the overall impedance value and thus guarantee an unchanged transconductance gain that can be defined as the ratio of the voltage gain to the load resistance. The amplifier intrinsic linearity is enhanced as voltage gain has been reduced.

In the embodiment represented in FIG. 3, the gain and load of the amplifier 20 in high linearity mode may be calculated as follows:

$$G_m = \frac{G_0}{R_{Load}} \qquad \text{Equation 4}$$

$$G_v = G_0$$

$$R_{Load} = \frac{\alpha}{(\alpha + 1)} \times R_L$$

In step S8, the amplifier 6, 10, 20, 30 writes value '1' in HLM register. Then the methods returns to step S3.

In some embodiments of the invention, the detection of the risky intermodulation scenarios may imply operation of communication between the RF transmitter and the RF receiver, between cellular Digital Base Band Integrated Circuit (DBB-IC) and Radio Frequency Integrated Circuit (RF-IC) of the wireless RF transmission-reception system and finally between connectivity and cellular radio engine.

A measurement receiver of the cellular RF-IC may be used to estimate the transmission signal power at the antenna 4. This information may be directly used to detect a risky scenario.

The cellular DBB-IC is capable of identifying the selected RF band. This information may also be directly used to detect a risky scenario.

An application processor of the mobile equipment is informed when the connectivity radio engine is powered-up and ready to work. This signal and its corresponding information may also be used to detect a risky scenario.

Embodiments of the invention enable a dynamic mode of operation for the amplifier 6, 10, 20, 30 by switching between nominal and HLM modes quickly and efficiently, based on the status of the three internal signals described above. As soon as one of them is off the amplifier switches back to its nominal mode of operation.

For example, when the mobile network requests a handover on another non-risky RF band during a communication or in idle mode, the DBB-IC signal permits to deactivate the HLM mode. Same procedure applies if connectivity radio engine is turned off or if own cellular transmitter signal is below maximum output power.

In this way, the mode of operation of the amplifier is modified only when needed. This improves the efficiency.

In addition, the amplifier according to some embodiments of the invention is built in a way that it exploits the ratio of circuit components making it insensitive to device mismatch.

Another advantage is that the system part of the invention which relates to the scenario detection method uses only valid internal signals coming from the same RF-IC or a neighbor circuit inside the same mobile platform. Therefore, no specific processing is required and consequently there is no latency in deciding which mode to use when needed.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the invention as broadly defined above.

For example, the invention includes embodiments where a cellular engine interferes with a connectivity engine or with different types of engine.

Expressions such as "comprise", "include", "incorporate", "contain", "is" and "have" are to be construed in a non-exclusive manner when interpreting the description and its associated claims, namely construed to allow for other items or components which are not explicitly defined also to be present. Reference to the singular is also to be construed in a reference to the plural and vice versa.

A person skilled in the art will readily appreciate that various parameters disclosed in the description may be modified and that various embodiments disclosed may be combined without departing from the scope of the invention.

The invention claimed is:

1. An amplifier for a wireless receiver, the amplifier comprising:
   a detection circuit configured to detect a risky intermodulation scenario in which the wireless receiver may be desensitized;

a voltage amplifier module having a voltage gain switchable between a first voltage gain value and a second voltage gain value higher than the first gain value; and a resistance module having a resistance switchable between a first resistance value and a second resistance value higher than the first resistance value;

wherein an output of the voltage amplifier module is connected to an input of the resistance module;

wherein the combination of the voltage amplifier module and the resistance module comprises a set of switches configured to set the voltage gain value and the resistance value; and wherein the amplifier is operable in:

a nominal mode of operation in which the voltage gain value is set to the second voltage gain value and the resistance value is set to the second resistance value to have a nominal mode ratio of the voltage gain value to the resistance value; and a high linearity mode of operation in which the voltage gain value is set to the first voltage gain value to improve linearity of the amplifier, and the resistance value is set to the first resistance value to have a high linearity mode ratio of the voltage gain value to the resistance value similar to the nominal mode ratio with less than a 5% difference between the ratios;

wherein the amplifier is configured to activate the high linearity mode of operation when the risky intermodulation scenario is detected.

2. An amplifier for a wireless receiver, the amplifier comprising:

a voltage amplifier module having a voltage gain switchable between a first voltage gain value and a second voltage gain value higher than the first gain value, wherein the voltage amplifier module comprises a fixed gain part with a fixed voltage gain and a commutable gain part with a commutable voltage gain;

a resistance module having a resistance switchable between a first resistance value and a second resistance value higher than the first resistance value, wherein the resistance module comprises a first resistance in parallel with a second resistance;

wherein an output of the voltage amplifier module is connected to an input of the resistance module;

wherein the combination of the voltage amplifier module and the resistance module comprises a set of switches configured to set the voltage gain value and the resistance value, wherein the set of switches comprises:

a first switch disposed in parallel with the commutable gain part;

a second switch disposed between the output of the commutable gain part and the input of the resistance module; and a third switch disposed between the input of the resistance module or output of the resistance module and the first resistance, the first and third switches being open in a nominal mode of operation and closed in a high linearity mode of operation, the second switch being closed in the nominal mode of operation and open in the high linearity mode of operation; and wherein the amplifier is operable in:

the nominal mode of operation in which the voltage gain value is set to the second voltage gain value and the resistance value is set to the second resistance value to have a nominal mode ratio of the voltage gain value to the resistance value; and the high linearity mode of operation in which the voltage gain value is set to the first voltage gain value to improve linearity of the amplifier, and the resistance value is set to the first resistance value to have a high linearity mode ratio of the voltage gain value to the resistance value similar to the nominal mode ratio with less than a 5% difference between the ratios.

3. The amplifier according to claim 2, configured to be connected to a detection circuit configured to detect a risky intermodulation scenario in which the wireless receiver may be desensitized, and wherein the amplifier is configured to activate the high linearity mode of operation when a risky intermodulation scenario is detected.

4. The amplifier according to claim 2, wherein the set of switches comprises a fourth switch disposed between the input of the resistance module or output of the resistance module and the second resistance, the fourth switch being closed in the nominal mode of operation and open in the high linearity mode of operation.

5. An amplifier for a wireless receiver, the amplifier comprising:

a voltage amplifier module having a voltage gain switchable between a first voltage gain value and a second voltage gain value higher than the first gain value, wherein the voltage amplifier module comprises a first fixed resistance in parallel with a first commutable resistance;

a resistance module having a resistance switchable between a first resistance value and a second resistance value higher than the first resistance value, wherein the resistance module comprises a second fixed resistance in parallel with a second commutable resistance; and wherein an output of the voltage amplifier module is connected to an input of the resistance module;

wherein the combination of the voltage amplifier module and the resistance module comprises a set of switches configured to set the voltage gain value and the resistance value, wherein the set of switches comprises:

a first switch disposed between an input of the voltage amplifier module and the first commutable resistance; and a second switch disposed between the input of the resistance module or output of the resistance module and the second commutable resistance, the first and second switches being open in a nominal mode of operation and closed in a high linearity mode of operation; and wherein the amplifier is operable in:

the nominal mode of operation in which the voltage gain value is set to the second voltage gain value and the resistance value is set to the second resistance value to have a nominal mode ratio of the voltage gain value to the resistance value; and the high linearity mode of operation in which the voltage gain value is set to the first voltage gain value to improve linearity of the amplifier, and the resistance value is set to the first resistance value to have a high linearity mode ratio of the voltage gain value to the resistance value similar to the nominal mode ratio with less than a 5% difference between the ratios.

6. A method for controlling an amplifier of a wireless receiver, the amplifier comprising a voltage amplifier module having a voltage gain switchable between a first voltage gain value and a second voltage gain value higher than the first gain value, and a resistance module having a resistance switchable between a first resistance value and a second resistance value higher than the first resistance value, an output of the voltage amplifier module being connected to an input of the resistance module, the combination of the voltage amplifier module and the resistance module comprising a set of switches configured to set the voltage gain value and the resistance value, the method comprising:

determining whether a risky intermodulation scenario, in which the wireless receiver may be desensitized, is detected;

if no risky intermodulation scenario is detected, activating a nominal mode of operation by setting the voltage gain value to the second voltage gain value, and by setting the resistance value to the second resistance value to have a nominal mode ratio of the voltage gain value to the resistance value; and if the risky intermodulation scenario is detected, activating a high linearity mode of operation by setting the voltage gain value to the first voltage gain value to improve linearity of the amplifier, and by setting the resistance value to the first resistance value to have a high linearity mode ratio of the voltage gain value to the resistance value similar to the nominal mode ratio with less than a 5% difference between the ratios.

7. The method according to claim 6, wherein the voltage amplifier module comprises a fixed gain part with a fixed voltage gain and a commutable gain part with a commutable voltage gain, the resistance module comprises a first resistance in parallel with a second resistance, and the set of switches comprises a first switch disposed in parallel with the commutable gain part, a second switch disposed between the output of the commutable gain part and the input of the resistance module, and a third switch disposed between the input of the resistance module and the first resistance, wherein:

activating the nominal mode of operation comprises opening the first and third switches and closing the second switch; and activating the high linearity mode of operation comprises closing the first and third switches and opening the second switch.

8. The method according to claim 7, wherein the set of switches comprises a fourth switch disposed between the input of the resistance module and the second resistance, wherein activating the nominal mode of operation further comprises closing the fourth switch, and wherein activating the high linearity mode of operation further comprises opening the fourth switch.

9. The method according to claim 6, wherein the voltage amplifier module comprises a first fixed resistance in parallel with a first commutable resistance, the resistance module comprises a second fixed resistance in parallel with a second commutable resistance, and the set of switches comprises a first switch disposed between an input of the voltage amplifier module and the first commutable resistance, and a second switch disposed between the input of the resistance module and the second commutable resistance, wherein:

activating the nominal mode of operation comprises opening the first and second switches; and activating the high linearity mode of operation comprises closing the first and second switches.

10. The method according to claim 6, wherein the wireless receiver is part of a radio frequency (RF) transmission-reception system of a user equipment, the user equipment further comprising a radio engine, and wherein determining whether a risky intermodulation scenario is detected comprises:

testing whether a risky RF band is selected; and if a risky RF band is selected, testing whether the radio engine is activated.

11. The method according to claim 10, wherein determining whether a risky intermodulation scenario is detected further comprises testing whether the transmission signal power is above a predetermined threshold.

12. A computer program product stored in a non-transitory computer readable medium for controlling data-processing unit, the computer program product having a computer program comprising program instructions, which when run on the data-processing unit cause the data-processing unit to control an amplifier of a wireless receiver, the amplifier comprising a voltage amplifier module having a voltage gain switchable between a first voltage gain value and a second voltage gain value higher than the first gain value, and a resistance module having a resistance switchable between a first resistance value and a second resistance value higher than the first resistance value, an output of the voltage amplifier module being connected to an input of the resistance module, the combination of the voltage amplifier module and the resistance module comprising a set of switches configured to set the voltage gain value and the resistance value, the program instructions when run on the data processing unit causing the data processing unit to:

determine whether a risky intermodulation scenario, in which the wireless receiver may be desensitized, is detected;

if no risky intermodulation scenario is detected, activate a nominal mode of operation by setting the voltage gain value to the second voltage gain value, and by setting the resistance value to the second resistance value to have a nominal mode ratio of the voltage gain value to the resistance value; and if the risky intermodulation scenario is detected, activate a high linearity mode of operation by setting the voltage gain value to the first voltage gain value to improve linearity of the amplifier, and by setting the resistance value to the first resistance value to have a high linearity mode ratio of the voltage gain value to the resistance value similar to the nominal mode ratio with less than 5% difference between the ratios.

13. The amplifier according to claim 5, configured to be connected to a detection circuit configured to detect a risky intermodulation scenario in which the wireless receiver may be desensitized, and wherein the amplifier is configured to activate the high linearity mode of operation when a risky intermodulation scenario is detected.

* * * * *